(12) United States Patent
Shin et al.

(10) Patent No.: US 8,715,532 B2
(45) Date of Patent: May 6, 2014

(54) REDUCED GRAPHENE OXIDE DOPED WITH DOPANT, THIN LAYER AND TRANSPARENT ELECTRODE

(75) Inventors: Hyeon-jin Shin, Suwon-si (KR); Jae-young Choi, Suwon-si (KR); Seon-mi Yoon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 12/171,551

(22) Filed: Jul. 11, 2008

(65) Prior Publication Data
US 2009/0146111 A1 Jun. 11, 2009

(30) Foreign Application Priority Data
Dec. 7, 2007 (KR) .................. 10-2007-0126947

(51) Int. Cl.
*H01B 1/00* (2006.01)
*H01B 1/04* (2006.01)
*B82Y 40/00* (2011.01)
*C01B 31/02* (2006.01)
*C01B 31/08* (2006.01)

(52) U.S. Cl.
USPC ........... 252/510; 252/500; 252/502; 252/506; 252/508; 252/518.1; 252/520.3; 252/521.5; 252/521.6; 423/445 R; 423/439; 423/579; 423/592.1; 977/734

(58) Field of Classification Search
USPC ............... 252/500–511, 518.1, 520.3, 521.5, 252/521.6; 423/439, 445 R, 579, 592.1; 977/734
See application file for complete search history.

(56) References Cited

U.S. PATENT DOCUMENTS

| | | | |
|---|---|---|---|
| 7,776,444 B2 | 8/2010 | Rinzler et al. | |
| 2003/0186059 A1* | 10/2003 | Hirata et al. | 428/408 |
| 2005/0070657 A1* | 3/2005 | Elkovitch et al. | 524/495 |
| 2006/0118901 A1* | 6/2006 | Williams et al. | 257/485 |
| 2006/0188723 A1* | 8/2006 | Rowley et al. | 428/408 |
| 2007/0092432 A1* | 4/2007 | Prud'Homme et al. | 423/448 |
| 2007/0098620 A1* | 5/2007 | Khabashesku et al. | 423/447.1 |
| 2007/0120095 A1 | 5/2007 | Gruner | |
| 2007/0131915 A1* | 6/2007 | Stankovich et al. | 252/511 |
| 2008/0088219 A1* | 4/2008 | Yoon et al. | 313/326 |
| 2008/0191606 A1 | 8/2008 | Geohegan et al. | |
| 2008/0299374 A1 | 12/2008 | Choi et al. | |
| 2008/0308407 A1 | 12/2008 | Rostovtsev et al. | |
| 2008/0311424 A1 | 12/2008 | Choi et al. | |

(Continued)

FOREIGN PATENT DOCUMENTS

| | | |
|---|---|---|
| JP | 2008056950 A | 3/2008 |
| KR | 1020040055622 A | 6/2004 |

(Continued)

OTHER PUBLICATIONS

Gomez-Navarro et al. ("Electronic Transport Properties of Individual Chemically Reduced Graphene Oxide Sheets" NanoLetters, vol. 7, pp. 3499-3503, online pub Oct. 18, 2007).*

(Continued)

*Primary Examiner* — Tri V Nguyen
(74) *Attorney, Agent, or Firm* — Cantor Colburn LLP

(57) ABSTRACT

Disclosed herein is a reduced graphene oxide doped with a dopant, and a thin layer, a transparent electrode, a display device and a solar cell including the reduced graphene oxide. The reduced graphene oxide doped with a dopant includes an organic dopant and/or an inorganic dopant.

7 Claims, 1 Drawing Sheet

(56) References Cited

U.S. PATENT DOCUMENTS

| | | | |
|---|---|---|---|
| 2008/0317982 A1 | 12/2008 | Hecht et al. | |
| 2009/0008712 A1 | 1/2009 | Choi et al. | |
| 2009/0022650 A1 | 1/2009 | Choi et al. | |
| 2009/0041652 A1 | 2/2009 | Shin et al. | |
| 2009/0117467 A1* | 5/2009 | Zhamu et al. | 429/231.8 |
| 2010/0022438 A1 | 1/2010 | Roy et al. | |
| 2010/0105834 A1* | 4/2010 | Tour et al. | 525/50 |
| 2010/0133480 A1 | 6/2010 | Shin et al. | |
| 2010/0140561 A1 | 6/2010 | Choi et al. | |
| 2011/0127471 A1 | 6/2011 | Shin et al. | |
| 2012/0080086 A1 | 4/2012 | Yoon et al. | |

FOREIGN PATENT DOCUMENTS

| | | |
|---|---|---|
| KR | 1020090059871 A | 6/2009 |
| KR | 1020090108459 A | 10/2009 |
| KR | 1020100031475 A | 3/2010 |

OTHER PUBLICATIONS

Eda et al. ("Transparent and conducting electrodes for organic electronics from reduced graphene oxide" Appl Phys Let, vol. 92, article 233305, online pub Jun. 13, 2008).*

Staudenmaier L. Verfahren, zurdarstellung der graphitsaure, Ber Dtsch Chem Ges 1898, 31, 1481-1499. Supplied by The British Library—"The world's knowledge".

William S. Hummers, Jr., et al, Preparation of Graphitic Oxide, Mar. 20, 1958, p. 1339, Contribution from the Baroid Division, National Lead Company.

Brodiebc, Sur le poids atomique graphite. Ann Chim Phys 1860, 59, 466-472. Supplied by The British Library—"The world's knowledge".

Sasha Stankovich, et al., Synthesis of graphene-based nanosheets via chemical reduction of exfoliated graphite oxide, Carbon 45 accepted Feb. 19, 2007, pp. 1558-1565, Science Direct.

Supinda Watcharotone, et al., Graphene-Silica Composite Thin Films as Transparent Conductors, Nano Letters, 2007, vol. 7, No. 7, 1888-1892.

Farmer, Damon B., et al., "Chemical Doping and Electron-Hole Conduction Asymmetry in Graphene Devices," Published in Nano Letters, 2009, vol. 9, No. 1, pp. 388-392.

Gierz, Isabella, et al., "Atomic Hole Doping of Graphene," Nano Letters, 2008, vol. 8, No. 12, pp. 4603-4607.

Khomyakov, P. A., et al., "First-principles study of the interaction and charge transfer between graphene and metals," Physical Review B, 79, 2009, pp. 195425-1-195425-12.

Lu, Y.H., et al., "Tuning the Electronic Structure of Graphene by an Organic Molecule," Letters, J. Phys. Chem. B, vol. 113, No. 1, 2009, pp. 2-5.

Non-Final Office Action from related U.S. Appl. No. 12/847,389, dated Jul. 25, 2012, 52 pages.

Yu, Young-Jun, et al., "Tuning the Graphene Work Function by Electric Field Effect," Nano Letters, 2009, vol. 9, No. 10, pp. 3430-3434.

Boero et al.,"A Mechanism of Adsorption of Beta-Nicotinamide Adenine Dinucleotide on Graphene Sheets: Experiment and Theory", Chem. Eur. J., 15, 2009, pp. 10851-10856.

Alonso et al.; The Interaction of Sulfuric Acid with Graphene and Formation of Adsorbed Crystals; Nanotechnology; 18, 485705; 2007, 7 pages.

Wang et al.; Transparent, Conductive Graphene Electrodes for Dye-Sensitized Solar Cells; Nano Letters; vol. 8, No. 1, 2008, pp. 323-327.

* cited by examiner

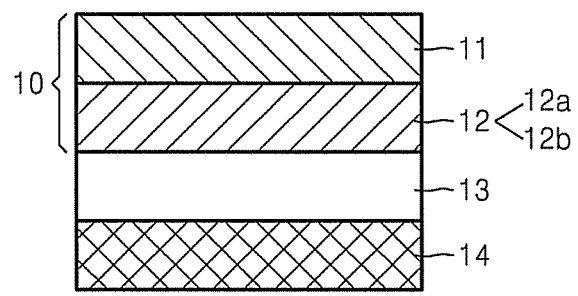

REDUCED GRAPHENE OXIDE DOPED WITH DOPANT, THIN LAYER AND TRANSPARENT ELECTRODE

This application claims priority to Korean Patent Application No. 10-2007-0126947, filed on Dec. 7, 2007, in the Korean Intellectual Property Office, and all the benefits accruing therefrom under 35 U.S.C. §119, the contents of which are incorporated herein in their entirety by reference.

BACKGROUND OF THE INVENTION

This disclosure relates to a reduced graphene oxide doped with a dopant. It also relates to a thin layer and a transparent electrode that includes the reduced graphene oxide.

Generally, graphite is a stack of two-dimensional graphene sheets formed from a planar array of carbon atoms bonded into hexagonal structures. Single or multiple-layered graphene sheets display advantageous properties. The most advantageous of these properties is that electrons flow in an entirely unhindered fashion in a graphene sheet. As a result, the electrons flow at the velocity of light in a vacuum. In addition, an unusual half-integer quantum Hall effect for both electrons and holes are observed in graphene sheets.

The electron mobility of graphene sheets is about 20,000 to 50,000 $cm^2/Vs$. Also, it is preferable to manufacture products using graphene sheets rather than carbon nanotubes, since products made from graphite are inexpensive while products made from carbon nanotubes which are used in applications similar to those in which graphene sheets are used, are expensive due to low yields during synthesis and purification processes even though the carbon nanotubes themselves are inexpensive. Single wall carbon nanotubes exhibit different metallic and semiconducting characteristics according to their chirality and diameter. Furthermore, single wall carbon nanotubes having identical semiconducting characteristics have different energy band gaps depending on their chirality and diameter. Thus, in order to obtain a metallic single wall carbon nanotube composition or a semiconducting single wall carbon nanotube composition, it is desirable to separate the single wall carbon nanotubes from each other in order to obtain desired metallic or semiconducting characteristics respectively. However, separating single wall carbon nanotubes is not a simple or inexpensive process.

On the other hand, it is advantageous to use graphene sheets since it is possible to design a device to exhibit desired electrical characteristics by arranging the graphene sheets so that their crystalline orientation is in a desired direction since their electrical properties vary with crystalline orientation. It is envisioned that these characteristics of graphene sheets will render them useful in carbonaceous electrical devices or carbonaceous electromagnetic devices in the future.

However, although graphene sheets have these advantageous characteristics, a process of economically and reproducibly preparing a large-sized graphene sheet has not yet been developed. Graphene sheets can be prepared using a micromechanical method or a SiC thermal decomposition method. According to the micromechanical method, a graphene sheet separated from graphite can be deposited on the surface of Scotch™ tape by attaching the tape to a graphite sample and detaching the tape. In this case, the separated graphene sheet does not include a uniform number of layers, and the graphene sheets do not have a uniform shape. Furthermore, a large-sized graphene sheet cannot be prepared using the micromechanical method. Meanwhile, in SiC thermal decomposition, a single crystal SiC is heated to remove Si by decomposition of the SiC on the surface thereof, and then residual carbon C forms a graphene sheet. However, single crystal SiC is very expensive, and a large-sized graphene sheet cannot be easily prepared.

Meanwhile, an attempt has recently been made to prepare graphene using a chemical process. The graphene is separated from graphite by treating graphite with a chemical substance. However, the process is not completely controllable. Another attempt is to form and disperse graphene oxide. Since graphene oxide is easily dispersed, a thin layer made of the graphene oxide can easily formed. Another method of manufacturing graphene is to use reduced graphene oxides. However, neither of these attempts reproduce the electrical properties of graphene. Recently, a graphene thin layer has been formed by mixing a graphene oxide and a silica substance, but this graphene thin layer does not have excellent properties either.

SUMMARY OF THE INVENTION

Disclosed herein is a reduced graphene oxide having improved electrical properties.

Disclosed herein too is a reduced graphene oxide thin layer having improved electrical properties.

Disclosed herein too is a transparent electrode that includes the graphene oxide thin layer.

Disclosed herein too is a method of preparing the reduced graphene oxide.

Disclosed herein too is a reduced graphene oxide comprising an organic dopant and/or an inorganic dopant.

The organic dopant may be selected from the group consisting of an ionic liquid such as $NO_2BF_4$, $NOBF_4$ and $NO_2SbF_6$, an acid such as HCl, $H_3PO_4$, $CH_3COOH$, $H_2SO_4$ and $HNO_3$, and an organic compound such as dichlorodicyanoquinone (DDQ), oxone, dimyristoylphosphatidylinositol (DMPI) and trifluoromethanesulfoneimide.

The inorganic dopant may be selected from the group consisting of $AuCl_3$, $HAuCl_4$, AgOTfs, $AgNO_3$ and aluminum trifluoromethanesulfonate.

The reduced graphene oxide may be prepared by reducing a graphene oxide obtained by oxidizing graphite.

Disclosed herein too is a reduced graphene oxide thin layer doped with an organic dopant and/or an inorganic dopant.

Disclosed herein too is a transparent electrode comprising the reduced graphene oxide thin layer.

The transparent electrode may be flexible.

Disclosed herein too is a method of preparing a reduced graphene oxide thin layer, the method comprising forming a graphene oxide layer by coating a graphene oxide dispersion on a substrate; reducing the graphene oxide by immersing the substrate comprising the graphene oxide layer in a reducing agent-containing solution; and doping an organic dopant and/or inorganic dopant on the reduced graphene oxide.

BRIEF DESCRIPTION OF THE DRAWINGS

The above and other features and advantages of the present invention will become more apparent by describing in detail exemplary embodiments thereof with reference to the attached drawing in which:

FIG. 1 shows a schematic structure of a dye-sensitized solar cell.

DETAILED DESCRIPTION OF THE INVENTION

Hereinafter, the present invention will now be described more fully with reference to the accompanying drawings, in which exemplary embodiments of the invention are shown.

Disclosed herein is a reduced graphene oxide. The reduced graphene oxide is doped with an organic dopant and/or an inorganic dopant to improve electrical conductivity and a thin layer formed using the reduced graphene oxide having improved conductivity can be efficiently applied to a transparent electrode of a variety of display devices or solar cells, a TFT semiconductor layer, and the like.

The term "graphene oxide" is an oxide prepared by oxidizing graphite. The graphene oxide is distinguished from graphite since the graphene oxide can be dispersed in a solution, and thus can be formed as a thin layer. Accordingly, a thin layer of the graphene oxide is formed using the graphene oxide dispersion and the thin layer is reduced to form a graphene in the form of a sheet. The term "reduced graphene oxide" used herein indicates a compound prepared by reducing the graphene oxide.

The "graphene" used herein indicates polycyclic aromatic molecules in which a plurality of carbon atoms are covalently bound to each other. The covalently bound carbon atoms form repeating units that comprise 6-membered rings, but can also form 5-membered rings and/or 7-membered rings. Accordingly, in the graphene it appears as if the covalently bound carbon atoms (usually, $sp^2$ bond) form a single layer. The graphene sheet may have various structures and the structure may vary according to the amount of the 5-membered rings and/or the 7-membered rings. The graphene may not only comprise a single layer, but may also comprise a plurality of layers of graphene up to a thickness of 100 nm. Generally, the side ends of the graphene are saturated with hydrogen atoms.

The reduced graphene oxide can have similar shapes and physical properties when compared with graphene. The electrical properties, particularly electrical conductivity, are reduced when compared with graphene. In order to improve the poor electrical properties of the reduced graphene oxide, the reduced graphene oxide is doped with an organic dopant and/or inorganic dopant.

The organic dopant included in the reduced graphene oxide may include at least one of an acid such as $CH_3COOH$, and an organic compound such as dichlorodicyanoquinone (DDQ), dimyristoylphosphatidylinositol (DMPI) and trifluoromethanesulfoneimide, but is not limited thereto. The inorganic dopant may include at least one of an ionic liquid such as $NO_2BF_4$, $NOBF_4$ and $NO_2SbF_6$, an acid such as HCl, $H_2PO_4$, $H_2SO_4$ and $HNO_3$, $AuCl_3$, $HAuCl_4$, silver trifluoromethanesulfonate (AgOTfs), $AgNO_3$, oxone (potassium peroxymonosulfate) and aluminum trifluoromethanesulfonate, but is not limited thereto.

The reduced graphene oxide does not have a full graphene structure (C═C/C—C conjugated structure) and has less C═C bonds compared to graphene. In other words, since oxygen atoms or nitrogen atoms are partially mixed between carbon atoms, the graphene has various band-gaps. Thus, the dopant reduces band-gap barriers between the reduced graphene oxides having various band-gaps by taking electrons from the reduced graphene oxide, and thus electrical properties of the reduced graphene oxide can be improved.

Since the graphene oxide can be dispersed in a solution it can be used to form a thin film. A thin layer of the reduced graphene oxide doped with a dopant can also be easily formed. Since a thin layer formed using the reduced graphene oxide that is doped with a dopant has high transmittance and conductivity, it can be applied to various fields such as transparent electrodes. For example, a reduced graphene oxide thin layer having improved electrical properties can be prepared by coating a solution including the graphene oxide on a substrate, e.g., a transparent flexible substrate, drying the resultant graphene oxide coating on the substrate, reducing the graphene oxide coating by immersing the resultant graphene oxide coating on the substrate in a reducing agent-containing solution for a predetermined period of time to obtain a reduced graphene oxide, and doping the reduced graphene oxide with an organic dopant and/or an inorganic dopant.

In the above-described process, the graphene oxide can be synthesized by methods of Staudenmaier L. Verfahren zurdarstellung der graphitsaure, Ber Dtsch Chem Ges 1898, 31, 1481-99), Hummers w. Offeman r. Preparation of graphite oxide. J Am Chem Soc 1958, 80, 1339, BrodieBC. Sur le poids atomique graphite. Ann Chim Phys 1860, 59, 466-72), and the like. The graphene oxide can be reduced by methods disclosed in Carbon 2007, 45, 1558, Nano Letter 2007, 7, 1888, and the like), which are incorporated herein by reference.

Any reducing agent that is commonly used in the art may be used as the reducing agent of the present invention without limitation, and examples of the reducing agent are $NaBH_4$, $N_2H_2$, $LiAlH_4$, TBAB, ethylene glycol, polyethylene glycol and sodium (Na).

The substrate used herein may be a glass substrate or a plastic substrate. Substrates formed of polyethylene terephthalate (PET), polycarbonate (PC), polyimide (PI), polyethylene naphthalate (PEN), polystyrene (PS), and the like may be used as the transparent flexible substrate.

The coating may be performed by spin coating, dip coating, spray coating, or the like.

Since the thin layer of the reduced graphene oxide doped with a dopant has improved transparency and conductivity it can be applied to various transparent electrodes, and the like. It has the same fundamental physical properties as graphene and can be made into the same shapes. In particular, the thin layer is economical since it is simply manufactured, and has high conductivity and uniformity. In addition, a large-sized thin layer can be manufactured and the thickness of the thin layer can be easily controlled by regulating the concentration of the graphene oxide dispersion and spraying conditions, and thus transmittance can be easily controlled. In particular, since the thin layer can have flexibility, it can be easily handled and applied to a flexible transparent electrode.

The transparent electrode including the thin layer may be efficiently applied to display devices such as a liquid crystal display device, an electronic paper display device and an organic light emitting device, and cells such as a solar cell.

When the flexible transparent electrode is applied to the display devices, the display devices are conveniently utilized since the display devices can be bent into a desirable shape. When the flexible transparent electrode is applied to the solar cells, the solar cells have various bent structures according to the light direction, and thus luminance efficiency can be improved.

When the transparent electrode including the reduced graphene oxide is applied to a variety of devices, the thickness of the transparent electrode may be controlled in order to facilitate the transmittance of light. For example, the thickness of the transparent electrode may be in the range of about 0.1 to about 200 nanometers (nm). When the thickness of the transparent electrode is greater than about 200 nm, transmittance may be reduced to decrease luminance efficiency. On the other hand, when the thickness of the transparent electrode is less than about 0.1 nm, sheet resistance is too low or the thin layer may not be uniformly formed.

An example of the solar cell including the transparent electrode having the reduced graphene oxide according to the present invention is a dye-sensitized solar cell shown in FIG. 1. The dye-sensitized solar cell includes a semiconductor electrode 10, an electrolyte layer 13 and an opposing electrode 14. The semiconductor electrode 10 includes a conductive transparent substrate 11 and a light absorbing layer 12, and may be prepared by coating a colloidal solution of a nanoparticulate oxide 12a on a conductive glass substrate, heating the resultant in a high temperature furnace, and adsorbing a dye 12b thereon.

The transparent electrode is used as the conductive transparent substrate 11. Such a transparent electrode is prepared by transferring the reduced graphene oxide doped with a dopant on a transparent substrate. Examples of the transparent substrate are transparent polymers such as polyethylene terephthalate, polycarbonate, polyimide and polyethylene naphthalate, or a glass substrate. The transparent electrode may also be used as the opposing electrode 14.

In order to form the dye-sensitized solar cell in a bendable configuration, for example, in a cylindrical structure, the opposing electrode, or the like in addition to the transparent electrode needs to be formed of a flexible material.

The nanoparticulate oxide 12a used in the solar cell may be a semiconductor particle, preferably an n-type semiconductor, which provides an anode current as a result of electrons ejected due to light excitation. Particularly, the nanoparticulate oxide 12a may be $TiO_2$, $SnO_2$, $ZnO_2$, $WO_3$, $Nb_2O_5$, $Al_2O_3$, MgO, $TiSrO_3$, or the like, preferably anatase-type $TiO_2$. Furthermore, the oxide is not limited thereto and such a metal oxide can be used alone or in a combination of at least two. Such semiconductor particles may have a large surface area in order for the dye adsorbed on the surface of the semiconductor particles to absorb a large amount of light. For this, the semiconductor particles may have an average particle diameter of 20 nm or less.

In addition, any dye that is commonly used in solar cells or photoelectric cells can be used as the dye 12b without limitation and a ruthenium complex may be used. Examples of the ruthenium complex are $RuL_2(SCN)_2$, $RuL_2(H_2O)_2$, $RuL_3$ and $RuL_2$, wherein L is 2,2'-bipyridyl-4,4'-dicarboxylate, or the like. However, any dye that has a charge separating capability and sensitization can be used as the dye 12b without limitation. Examples of the dye 12b may be a xanthine dye such as rhodamine B, rose bengal, eosin and erythrosin, a cyanine dye such as quinocyanine and kryptocyanine, a basic dye such as phenosafranine, tyocyn and methylene blue, a porphyrin-based compound such as chlorophyll, Zn porphyrin and Mg porphyrin, an azo dye, a compex such as phthalocyanine and Ru trisbipyridyl, an anthraquinone-based dye and a polycyclic quinone-based dye. Anthraquinone-based dye and a polycyclic quinone-based dye that are part of a ruthenium complex may also be used. The aforementioned dyes can be used alone or in a combination of at least two.

The thickness of the light absorbing layer 12 including the nanoparticulate oxide 12a and the dye 12b may be about 15 micrometers (microns), and preferably in the range of about 1 to about 15 microns, since the light absorbing layer 12 has high series resistance due to its structure and the increased series resistance causes reduction in conversion efficiency. Thus, the thickness of the light absorbing layer 12 is controlled to less than about 15 microns in order to maintain its function and to maintain the series resistance at a low level and prevent reduction in conversion efficiency.

The electrolyte layer 13 used in the dye-sensitized solar cell may be a liquid electrolyte, an ionic liquid electrolyte, an ionic gel electrolyte, a polymer electrolyte and a complex thereof. The electrolyte layer 13 is mainly formed of an electrolyte and includes the light absorbing layer 12. The electrolyte is infiltrated into the light absorbing layer 12 to form the electrolyte layer 13. An iodide-acetonitrile solution may be used as the electrolyte, but any material that has hole transporting capability can be used without limitation.

In addition, the dye-sensitized solar cell may further include a catalyst layer. The catalyst layer facilitates oxidation and reduction reaction of the dye-sensitized solar cell. Platinum, carbon, graphite, carbon nanotubes, carbon black, p-type semiconductors and a complex thereof may be used as the catalyst. The catalyst layer is interposed between the electrolyte layer and the opposing electrode. The surface area of the catalyst may be enlarged using microstructure. For example, platinum black can be preferably employed for platinum catalysts and porous carbon is preferably employed for carbon catalysts. The platinum black may be prepared by anodizing platinum, treating platinum with chloroplatinic acid, or the like. The porous carbon may be prepared by sintering carbon particles, calcining an organic polymer, or the like.

The dye-sensitized solar cell has excellent conductivity, and high luminance efficiency and processability by employing a flexible transparent electrode having a graphene sheet or a reduced graphene oxide thin layer that is doped with the dopant.

Examples of display devices using the transparent electrode including the reduced graphene oxide doped with a dopant are an electronic paper display device, an organic light emitting device and a liquid crystal display device. The organic light emitting device is an active light emitting display device that emits light by recombination of electrons and holes in a thin layer made of a fluorescent or phosphorescent organic compound when a current is applied to the thin layer. An exemplary organic light emitting device has a structure that comprises an anode, a hole transport layer, an emitting layer, an electron transport layer and a cathode which are sequentially formed on a substrate. In order to facilitate the injection of electrons and holes, the organic light emitting device may further include an electron injection layer and a hole injection layer. If desired, a hole blocking layer, a buffer layer, and the like may further be included. It is desirable for the anode to have a high transparency and electrical conductivity, and thus a transparent electrode having a graphene sheet according to the present invention is efficiently applied to the anode.

The hole transport layer may be formed of, for example, polytriphenylamine, but any material that is commonly used to form a hole transport layer may be used without limitation.

The electron transport layer may be formed of, for example, polyoxadiazole, but any material that is commonly used to form an electron transport layer may be used without limitation.

Any fluorescent or phosphorescent materials that are commonly used in the art as an emitting material may be used to form the emitting layer without limitation. However, the emitting material may further be selected from the group consisting of a polymer host, a low molecular weight host, a non-radiative polymer matrix, and a mixture of a polymer and a low molecular weight host. Here, any of the polymer host, the low molecular weight host and the non-radiative polymer matrix that are commonly used in the formation of an emitting layer for an organic light emitting device may be used. Examples of the polymer host are poly(vinylcarbazole), polyfluorene, poly(p-phenylene vinylene) and polythiophene. Examples of the low molecular weight host are 4,4'-N,N'-dicarbazol-biphenyl (CBP), 4,4'-bis[9-(3,6-biphenylcarbozolyl)]-1-1,1'-biphenyl{4,4'-bis[9-(3,6-biphenylcarbazolyl)]-1-1,1'-biphenyl}, 9,10-bis[(2',7'-t-butyl)-9',9"-(spirobifluorenyl)anthracene and tetrafluorene. Examples of the non-radiative polymer matrix are polymethylmethacrylate and polystyrene. The emitting layer may be prepared by vacuum deposition, sputtering, printing, coating, inkjet, or the like.

The organic light emitting device according to the present invention may be prepared using emitting materials that are commonly used in the preparation of an organic light emitting device without particular devices or methods.

The present invention will now be described in greater detail with reference to the following examples. The following examples are for illustrative purposes only and are not intended to limit the scope of the invention.

EXAMPLES

Examples 1 to 13

Preparation of Graphene Oxide 1 mg of pure graphite (99.999%, -200 mesh, Alfar Aesar, Inc.), 20 ml of fuming nitric acid and 8.5 mg of sodium chloride oxide were mixed at room temperature. When the mixture was stirred for 24 hours, the mixture was washed, filtered and cleaned to prepare a graphene oxide.
Preparation of Film 2 mg of the graphene oxide was added to 20 ml of deionized (DI) water, the pH of the mixture was adjusted to 7 or higher using NaOH, and the mixture was sonicated for 2 hours. Then, 200 ml of thus formed aqueous solution was sprayed on a 5 cm×5 cm polyethylene terephthalate substrate using spay coating. The substrate was immersed in a 50 mM $NaBH_4$ solution for 2.5 days to reduce the graphene oxide, and thus a reduced graphene oxide was obtained. The reduced graphene oxide was doped with dopants listed in Table 1 below.
Doping A 20 mM dopant solution was loaded on a film, and after 30 seconds, spin coating was performed at 2000 rpm for 60 seconds.

In Examples 10 to 13, the reduced graphene oxide was dipped in an undiluted solution of the acidic compound for 1 hour, washed with water and dried using spin coating.

Transmittance and sheet resistance of the reduced graphene oxides were measured before and after the doping, and the results are shown in Table 1 below. The transmittance was evaluated by measuring UV absorbance of the reduced graphene oxides at 550 nm, and the sheet resistance was measured using a 4-probe method.

TABLE 1

| | | Transmittance | | | Sheet resistance | | |
|---|---|---|---|---|---|---|---|
| | Dopant | before 550 nm | after 550 nm | change % | before kohm/sq | after kohm/sq | change % |
| Example 1 | $AuCl_3$ | 74 | 70 | 6 | 2.76 | 1.40 | 49.2 |
| Example 2 | AgOTfS | 81 | 76 | 7 | 4.01 | 2.20 | 45.2 |
| Example 3 | $NO_2BF_4$ | 78 | 73 | 7 | 3.13 | 2.31 | 26.1 |
| Example 4 | $NOBF_4$ | 75 | 70 | 7 | 3.04 | 2.36 | 22.4 |
| Example 5 | NHFA | 73 | 68 | 7 | 2.79 | 2.13 | 23.6 |
| Example 6 | DDQ | 74 | 68 | 7 | 2.97 | 2.49 | 16.0 |
| Example 7 | oxone | 80 | 71 | 12 | 3.47 | 2.86 | 17.6 |
| Example 8 | DMPI | 81 | 72 | 11 | 4.02 | 3.22 | 20.0 |
| Example 9 | TfSI | 81 | 75 | 7 | 3.45 | 2.95 | 14.6 |
| Example 10 | $CH_3COOH$ | 90 | 87 | 3 | 5.91 | 4.58 | 22.5 |
| Example 11 | HCl | 89 | 85 | 4 | 6.34 | 3.49 | 45.0 |
| Example 12 | $H_2NO_3$ | 89 | 86 | 3 | 6.14 | 1.91 | 68.9 |
| Example 13 | $H_2PO_4$ | 90 | 87 | 3 | 6.12 | 3.22 | 47.4 |

As shown in Table 1, the transmittance was not sharply reduced after the doping, but conductivity was increased by about 70%. In particular, conductivity was sharply increased when using the acidic and inorganic dopants.

Example 14

Preparation of Solar Cell

A paste of titanium oxide particles having a particle size of 5 to 25 nm was coated on a transparent electrode prepared according to Example 1 to an area of 1 $cm^2$, and the resultant was calcined at a low temperature (at 150° C. or less) to prepare a porous titanium oxide layer having a thickness of about 15 μm. Then, dye adsorbing treatment was performed in a 0.3 mM solution of Ru(4,4'-dicarboxy-2,2'-bipyridine)$_2$ (NCS)$_2$ dissolved in ethanol for 12 hours or longer at room temperature. Then, the porous titanium oxide layer on which the dye was adsorbed was washed using ethanol and dried at room temperature to prepare a photocathode.

A Pt reduction electrode was deposited on a transparent electrode according to Example 1 by sputtering and a microhole was formed using a drill having a diameter of 0.75 mm for injection of an electrolyte to prepare an opposing electrode.

The photocathode and the opposing electrode were combined by placing a 60 μm thick thermoplastic polymer film between the photocathode and the opposing electrode and pressing them at 100° C. for 9 seconds. An oxidation-reduction electrolyte was injected via the microhole formed in the opposing electrode and the microhole was blocked using a cover glass and a thermoplastic polymer film to prepare a dye-sensitized solar cell. Here, the oxidation-reduction electrolyte was a solution in which 21.928 g of tertrapropylammonium iodide and 1.931 g of 12 were dissolved in a solvent having 80% ethylene carbonate and 20% of acetonitrile.

Example 15

Preparation of Organic Light Emitting Device

An electrode pattern was formed on a transparent electrode according to Example 1, and washed. Poly(3,4-ethylenedioxythiophene) (PEDOT) was coated on the washed transparent electrode to a thickness of 50 nm, and the resultant was baked at 120° C. for about 5 minutes to prepare a hole injection layer.

A green 223 polymer was spin coated on the hole injection layer, and baked at 100° C. for 1 hour. A solvent was completely removed in a vacuum oven to form an emitting layer with a thickness of 80 nm.

Then, $Alq_3$ was vacuum deposited on the polymer emitting layer using a vacuum depositor at 1.0 Å/sec while maintaining the vacuum level at 4×10⁻⁶ torr or less to form an electron transport layer with a thickness of 30 nm. LiF was vacuum deposited at 0.1 Å/sec to form an electron injection layer with a thickness of 5 nm.

Then, Al was vacuum deposited at 10 Å/sec to form a cathode with a thickness of 200 nm, and the resultant encapsulated to prepare an organic light emitting device. The encapsulation was performed by adding BaO powder in a dry nitrogen atmosphere glove box, sealing with a metal can, and treating the organic light emitting device using a UV-curing agent.

Since the reduced graphene oxide doped with a dopant according to the present invention can have improved electrical properties and a large-sized thin film can be economically prepared, a transparent electrode having improved transmittance and conductivity can be prepared using the reduced graphene oxide. Such a transparent electrode can be applied to a variety of display devices, solar cells, and the like.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A composition comprising:
    a reduced graphene oxide, the reduced graphene oxide comprising an organic dopant selected from the group consisting of dichlorodicyanoquinone, dimyristoylphosphatidylinositol, and trifluoromethanesulfoneimide, and an inorganic dopant selected from the group consisting of $AuCl_3$, $HAuCl_4$, AgOTfs, $AgNO_3$, $NO_2BF_4$, $NOBF_4$, $NO_2SbF_6$, HCl, $H_2PO_4$, $H_2SO_4$, $HNO_3$, potassium monopersulfate, and aluminum trifluoromethanesulfonate.

2. The composition of claim 1, wherein the reduced graphene oxide is prepared by reducing a graphene oxide obtained by oxidizing graphite.

3. A reduced graphene oxide thin layer comprising the composition according to claim 1.

4. A transparent electrode comprising the reduced graphene oxide thin layer of claim 3.

5. The transparent electrode of claim 4, wherein the transparent electrode is flexible.

6. A method of preparing a reduced graphene oxide thin layer, the method comprising:
    coating a graphene oxide dispersion on a substrate to form a graphene oxide layer;
    reducing the graphene oxide layer to form a reduced graphene layer; the reducing being accomplished by immersing the substrate and the graphene oxide layer disposed thereon in a reducing agent-containing solution; and
    doping the reduced graphene oxide with an organic dopant and/or an inorganic dopant, wherein
    the organic dopant selected from the group consisting of dichlorodicyanoquinone, dimyristoylphosphatidylinositol, and trifluoromethanesulfoneimide, and
    the inorganic dopant is selected from the group consisting of $AuCl_3$, $HAuCl_4$, AgOTfs, $AgNO_3$, $NO_2BF_4$, $NOBF_4$, $NO_2SbF_6$, HCl, $H_2PO_4$, $H_2SO_4$, $HNO_3$, potassium monopersulfate, and aluminum trifluoromethanesulfonate.

7. The method of claim 6, wherein the inorganic dopant is selected from the group consisting of $AuCl_3$, $HAuCl_4$, AgOTfs, $AgNO_3$ and aluminum trifluoromethanesulfonate.

* * * * *